US009966365B2

(12) United States Patent
He et al.

(10) Patent No.: US 9,966,365 B2
(45) Date of Patent: May 8, 2018

(54) DISPLAY DEVICE AND FABRICATING METHOD

(71) Applicant: BOE TECHNOLOGY GROUP CO., LTD, Beijing (CN)

(72) Inventors: Xiaolong He, Beijing (CN); Bin Zhang, Beijing (CN); Shi Shu, Beijing (CN); Qi Yao, Beijing (CN); Zhanfeng Cao, Beijing (CN); Seong Yeol Yoo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 15/108,540

(22) PCT Filed: Dec. 10, 2015

(86) PCT No.: PCT/CN2015/097026
§ 371 (c)(1),
(2) Date: Jun. 27, 2016

(87) PCT Pub. No.: WO2017/020471
PCT Pub. Date: Feb. 9, 2017

(65) Prior Publication Data
US 2017/0229429 A1    Aug. 10, 2017

(30) Foreign Application Priority Data
Aug. 4, 2015   (CN) .......................... 2015 1 0471654

(51) Int. Cl.
*H01L 25/075*   (2006.01)
*H01L 33/00*    (2010.01)
(Continued)

(52) U.S. Cl.
CPC ............ *H01L 25/0753* (2013.01); *G09F 9/33* (2013.01); *H01L 25/167* (2013.01);
(Continued)

(58) Field of Classification Search
CPC ... H01L 25/0753; H01L 25/167; H01L 25/50; H01L 33/502; H01L 33/505; H01L 33/58;
(Continued)

(56) References Cited

U.S. PATENT DOCUMENTS 8,723,768 B2 *   5/2014  Egi ....................... C09K 11/06
                                                   345/32
9,484,504 B2 * 11/2016  Bibl ..................... H01L 33/504
(Continued)

FOREIGN PATENT DOCUMENTS

CN   2638097 Y     9/2004
CN   102023380 A   4/2011
(Continued)

OTHER PUBLICATIONS

The World Intellectual Property Organization (WIPO) International Search Report for PCT/CN2015/097026 dated Apr. 28, 2016.
(Continued)

*Primary Examiner* — Nikolay Yushin
(74) *Attorney, Agent, or Firm* — Anova Law Group, PLLC

(57) ABSTRACT

In accordance with various embodiments, the disclosed subject matter provides a display device and a related fabricating method. In some embodiments, the display device comprises: a substrate and a plurality of display units on the substrate, wherein each of the plurality of display units comprises: a first color sub-pixel, comprising a first quantum dot material and a first light source, wherein the first color sub-pixel is configured to provide a first color light by stimulating the first quantum dot material with the first light source; and a second color sub-pixel, comprising a second quantum dot material and a second light source, wherein the second color sub-pixel is configured to provide
(Continued)

a second color light by stimulating the second quantum dot material with the second light source.

20 Claims, 3 Drawing Sheets

(51) Int. Cl.
  *G09F 9/33* (2006.01)
  *H01L 33/60* (2010.01)
  *H01L 33/50* (2010.01)
  *H01L 33/64* (2010.01)
  *H01L 25/16* (2006.01)
  *H01L 33/58* (2010.01)

(52) U.S. Cl.
  CPC .......... *H01L 33/502* (2013.01); *H01L 33/505* (2013.01); *H01L 33/58* (2013.01); *H01L 33/60* (2013.01); *H01L 33/644* (2013.01); *H01L 2933/0033* (2013.01); *H01L 2933/0041* (2013.01); *H01L 2933/0058* (2013.01); *H01L 2933/0075* (2013.01)

(58) Field of Classification Search
  CPC ................... H01L 33/60; H01L 33/644; H01L 2933/0033; H01L 2933/0041; H01L 2933/0058; H01L 2933/0075; G09F 9/33; G09F 9/30; G09F 9/372; G09F 9/00
  See application file for complete search history.

(56) References Cited

U.S. PATENT DOCUMENTS

| | | | |
|---|---|---|---|
| 9,507,206 B2 * | 11/2016 | Li | G02F 1/133621 |
| 2005/0146258 A1 | 7/2005 | Weiss et al. | |
| 2011/0069369 A1 | 3/2011 | Park et al. | |
| 2014/0160408 A1 * | 6/2014 | Cho | G02F 1/133617 349/110 |
| 2014/0339495 A1 * | 11/2014 | Bibl | H01L 33/504 257/13 |
| 2015/0301408 A1 * | 10/2015 | Li | G02F 1/133621 362/84 |
| 2016/0220711 A1 * | 8/2016 | DeMore | C07K 16/18 |

FOREIGN PATENT DOCUMENTS

| | | |
|---|---|---|
| CN | 103278876 A | 9/2013 |
| CN | 104819404 A | 8/2015 |
| CN | 104932136 A | 9/2015 |
| CN | 105096749 A | 11/2015 |
| KR | 20120078883 A | 7/2012 |

OTHER PUBLICATIONS

State Intellectual Property Office of the P.R.C (SIPO) Office Action 1 for 2015104716547 dated Apr. 1, 2017 20 Pages.

\* cited by examiner

DISPLAY DEVICE AND FABRICATING METHOD

CROSS-REFERENCES TO RELATED APPLICATIONS

This PCT patent application claims priority of Chinese Patent Application No. 201510471654.7, filed on Aug. 4, 2015, the entire content of which is incorporated by reference herein.

TECHNICAL FIELD

The disclosed subject matter generally relates to the display technologies and, more particularly, relates to a display device, and a related fabricating method.

BACKGROUND

Along with the development of display technology, outdoor large-screen display becomes a popular display research area. The size of conventional liquid crystal display (LCD) is limited by the fabricating process of display substrate and the driving method of thin-film-transistor. So it is difficult to achieve a large-screen outdoor LCD display. The outdoor large-screen displays are generally light emitting diode (LED) chip array displays. However, the light emitting diode chip of LED chip array displays has a wide emission spectrum, resulting in a narrow color gamut of the display device.

Accordingly, it is desirable to provide a display device, and a related fabricating method.

BRIEF SUMMARY

In accordance with various embodiments, the disclosed subject matter provides a display device and a related fabricating method.

On aspect of the disclosed subject matter provides a display device. The display device comprising: a substrate; and a plurality of display units on the substrate, wherein each of the plurality of display units comprises: a first color sub-pixel, comprising a first quantum dot material and a first light source, wherein the first color sub-pixel is configured to provide a first color light by stimulating the first quantum dot material with the first light source; and a second color sub-pixel, comprising a second quantum dot material and a second light source, wherein the second color sub-pixel is configured to provide a second color light by stimulating the second quantum dot material with the second light source.

In some embodiments, the first quantum dot material and the second quantum dot material comprise nanoparticles made of Group II-VI or Group III-V elements.

In some embodiments, the first quantum dot material and the second quantum dot material are same quantum dot material but have different sizes.

In some embodiments, the first color light is red light and the second color light is green light; the first quantum dot material comprises nanoparticles of CuInSe or InP; and the second quantum dot material comprises nanoparticles of CuInS.

In some embodiments, each of the plurality of display units further comprises a third color sub-pixel that comprises a third light source and a third quantum dot material, wherein the third subunit is configured to provide a third color light by stimulating the third quantum dot material with the third light source.

In some embodiments, the third color light is blue light; the third light source is a ultraviolet (UV) light source; and the third quantum dot material comprises nanoparticles of ZnS or CdS.

In some embodiments, each of the plurality of display units further comprises a third color sub-pixel that comprises a third light source and a transparent material, wherein the transparent material transmits a third color light emitting from the third light source.

In some embodiments, the first light source, the second light source and the third light source are blue LED light sources.

In some embodiments, each of the plurality of display units further comprises isolating channels for optical isolating the first color sub-pixel, the second color sub-pixel and the third color sub-pixel from each other.

In some embodiments, each isolating channels have reflecting inner surfaces for reflecting light.

In some embodiments, each of the plurality of display units further comprises a light filter layer.

In some embodiments, the display device further comprises: a driving circuit connecting with the plurality of light sources; and a heat sink plate located on the driving circuit.

Another aspect of the disclosed subject matter provides a method for fabricating the disclosed display device. The method comprises: providing a substrate; and setting a plurality of light sources on the substrate; forming a plurality of first color sub-pixels by forming a first quantum dot material associated with a first subset of the plurality of light sources; and forming a plurality of second color sub-pixels by forming a second quantum dot material associated with a second subset of the plurality of light sources; wherein each of the plurality of first color sub-pixels can provide a first color light by stimulating the first quantum dot material with one corresponding light source in the first subset of the plurality of light sources; and wherein each of the plurality of the second color sub-pixels can provide a second color light by stimulating the second quantum dot material with one corresponding light source in the second subset of the plurality of light sources.

In some embodiments, the first quantum dot material comprise nanoparticles of a material in a first size range; and the second quantum dot material comprise nanoparticles of the material in a second size range.

In some embodiments, the method further comprises forming a plurality of third color sub-pixels by forming a third quantum dot material associated with a third subset of the plurality of light sources; wherein each of the plurality of third color sub-pixels can provide a third color light by stimulating the third quantum dot material with one corresponding light source in the third subset of the plurality of light sources.

In some embodiments, the method further comprises forming a plurality of third color sub-pixels by forming a transparent material associated with a third subset of the plurality of light sources; wherein each of the plurality of third color sub-pixels can provide a third color light by transmits a third color light emitting from one corresponding light source in the third subset of the plurality of light sources through the transparent material.

In some embodiments, the method further comprises forming a plurality of isolating channels to isolate the plurality of first color sub-pixels, and the plurality of second color sub-pixels from each other.

In some embodiments, the method further comprises forming reflecting inner surfaces for each isolating channel.

In some embodiments, the method further comprises setting a driving circuit connecting with the plurality of light sources.

In some embodiments, the method further comprises setting a heat sink plate located on the driving circuit.

In some embodiments, the method further comprises forming a light filter layer on the plurality of isolating channels.

In some embodiments, the method further comprises forming a cover layer on the plurality of isolating channels.

Other aspects of the present disclosure can be understood by those skilled in the art in light of the description, the claims, and the drawings of the present disclosure.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

For those skilled in the art to better understand the technical solution of the disclosed subject matter, reference will now be made in detail to exemplary embodiments of the disclosed subject matter, which are illustrated in the accompanying drawings. Wherever possible, the same reference numbers will be used throughout the drawings to refer to the same or like parts.

In accordance with various embodiments, the disclosed subject matter provides a display device, and a related fabricating method.

On aspect of the disclosed subject matter provides a display device. The display device can comprise a substrate and a plurality of display units on the substrate. Each of the plurality of display units comprises: a first color sub-pixel, comprising a first quantum dot material and a first light source, wherein the first color sub-pixel is configured to provide a first color light by stimulating the first quantum dot material with the first light source; and a second color sub-pixel, comprising a second quantum dot material and a second light source, wherein the second color sub-pixel is configured to provide a second color light by stimulating the second quantum dot material with the second light source.

In some embodiments, the display device comprises a substrate and multiple display units above the substrate. For example, FIGS. 1 and 2 show schematic structure diagrams of two exemplary display units of a display device in accordance with some embodiments of the disclosed subject matter.

Figure 1:
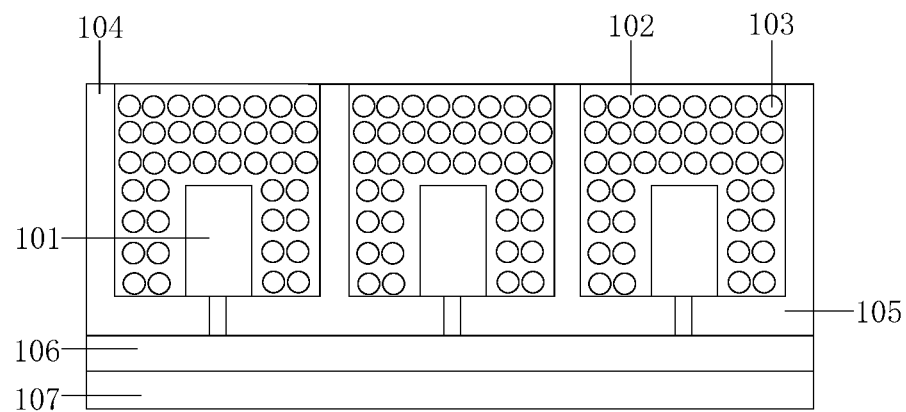
FIG. 1 is a schematic structure diagram of an exemplary display unit of a display device in accordance with some embodiments of the disclosed subject matter.
Figure 2:
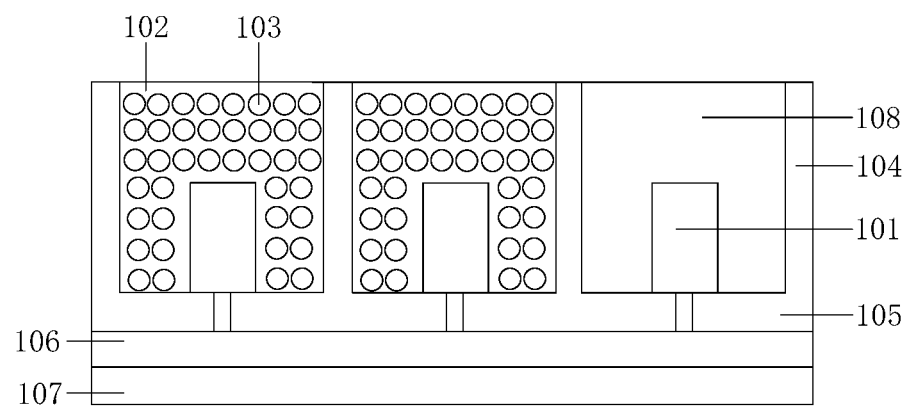
FIG. 2 is a schematic structure diagram of another exemplary display unit of the display device in accordance with some embodiments of the disclosed subject matter.

As illustrated in FIG. 1, a first exemplary display unit can include multiple light sources 101 and multiple quantum dot material regions 102. In some embodiments, a display unit can include three subunits. Each subunit corresponds to a color sub-pixel, and can include a light source 101 and a quantum dot material region 102.

The material constituting the quantum dot material region 102 includes quantum dot material. In some embodiments, the quantum dots material can have photoluminescence ability. The quantum dot material can be provided around the light exiting surfaces of one or more light sources 101. For example, one quantum dot material region 102 can correspond to one light source 101, which can make a high resolution and a small mixed light influence. As another example, one quantum dot material region 102 can correspond to multiple light sources 101, which can make a low resolution and relatively large pixels. As yet another example, multiple quantum dot material regions 102 can correspond to one light source 101, which can make a high brightness.

In some embodiments, quantum dot material is a solid material that multiple quantum dots 103 are uniformly distributed therein. The solid material encases one or more light sources 101. In some embodiments, the solid material also comprises photoresist.

In some embodiments, light source 101 is used to emit light for stimulating multiple quantum dots 103. The wavelength of the light emitted from light source 101 is generally no more than 450 nm. In some embodiments, light sources 101 can be ultraviolet (UV) light sources or blue light-emitting-diode (LED) light sources. Normally, a short wavelength light can stimulate the quantum dot material to produce longer wavelength light.

In some embodiments, the quantum dot material can produce color light when multiple quantum dots 103 are in excited states. In some embodiments, the display device can provide high color gamut light and keep a low power consumption by exciting quantum dots 103.

In some embodiments, quantum dot 103 can be nanocrystal, which is a nanoparticle made of Group II-VI or Group III-V elements. For example, quantum dot 103 can be nanocrystal of cadmium selenide (CdSe), indium phosphide (InP), copper indium gallium selenide (CuInSe), copper indium sulfur (CuInS), or other suitable quantum dot material. In some embodiments, the quantum dot material can also include single layer or multi-layer of coated cadmium sulfur (CdS) or zinc sulfur (ZnS).

A quantum dot 103 can include electron-hole pairs. The number of the electron-hole pairs is an integer, for example, between 1 to 100. So a charge of a quantum dot 103 is an integer multiple of the elementary charge. The particle size of a quantum dot 103 is generally between 1 nm to 10 nm. In a quantum dot 103, due to the quantum confinement of the electrons and holes, the continuous band structure of single electron or hole no longer exists, the quantum dot 103 can have a discrete-level energy structure which is more like a molecular property. Therefore, a stimulated quantum dot 103 can emit light.

In some embodiments, quantum dot material region 102 includes a first color region, a second color region, and a third color region. The first color region can emit red light when quantum dots 103 in the first color region are in the excited states, the second color region can emit green light when quantum dots 103 in the second color region are in the excited state, the third color region can emit blue light when quantum dots 103 in the third color region are in the excited state.

In some embodiments, quantum dot 103 can have quantum size effect. For same quantum dot material, a quantum dot has a large size can emit light with longer wavelength. For example, a 5 nm-7 nm CdSe particle can emit red light, while a 3 nm-5 nm CdSe particle can emit green light.

In some embodiments, different quantum dot materials can be used for emit different color light. For example, nanoparticles of CuInSe or InP can be used for emit red light, nanoparticles of CuInS can be used for emit green light. In such example, the sizes of the nanoparticles can in a range of 8 nm-12 nm. As another example, a UV light source can make 2 nm-4 nm ZnS or CdS nanoparticles to emit blue light.

In some embodiments, a color filter layer is located above the display unit. The color filter layer can include multiple color areas corresponding to the first color region, the second color region, and the third color region. The color filter layer is used to adjust the light emitted from the quantum dot material region for making a white light when the quantum dots 103 are in the excited states. Therefore, a color display function can be realized.

In some embodiments, the display unit can further comprise isolating wall 104 for isolating light between neighboring color regions. Isolating wall 104 can avoid the interferences between different quantum dot material regions 102, thereby improve the contrast of the display device.

In some embodiments, the display unit can further comprise isolating layer 105 below light source 101. Isolating layer 105 and multiple isolating walls 104 can be integrated to form multiple isolating channels, and quantum dot material can be located in the multiple isolating channels. In some embodiments, the material of isolating wall 104 and isolating layer 105 can include a black resin material. The multiple isolating channels can be used for optical isolating adjacent subunits.

In some embodiments, the inner surfaces of isolating wall 104 and/or the inner surface of isolation layer 105 can be light reflecting surfaces for reflecting the light emitted from light source 101 and quantum dot material region 102.

In some embodiments, the display unit can further comprise driving circuit 106 and heat sink plate 107. Driving circuit 106 is connected with multiple light sources 101, and is located above heat sink plate 107. Driving circuit 106 can be used for supplying driving signals to multiple light sources 101, and heat sink plate 107 can be used for heat dissipation of driving circuit 106 and the display unit.

Turing to FIG. 2, a schematic structure diagram of a second exemplary display unit of a display device is shown in accordance with some embodiments of the disclosed subject matter.

As illustrated, comparing to the first exemplary display unit described above in FIG. 1, the second exemplary display unit also includes a first color region, a second color region, but does not include a third region. Instead, a transparent region 108 is included in the second exemplary display unit.

In some embodiments, transparent region 108 can include one light source 101 and an optical layer surrounding the light source 101. The optical layer is a transparent material, such as a transparent resin material. Transparent region 108 can be used for transmitting the light emitted from the light source 101 and the transparent material can make the emitted light soft and uniform.

In some embodiments, the light source 101 in transparent region 108 includes a blue light emitting diode. So the first color region can emit red light when quantum dots 103 in the first color region are in the excited states, the second color region can emit green light when quantum dots 103 in the second color region are in the excited state, and the transparent region 108 can transmit blue light from the blue light emitting diode.

In some embodiments, the light sources 101 in all three regions can be blue LED light sources. The display unit corresponds to a pixel and the three subunits correspond to three color sub-pixels.

Accordingly, a display device is provided. The display device can include a substrate and multiple display units above the substrate. The multiple display units can include multiple display units shown in FIG. 1, and/or multiple display units shown in FIG. 2. A display unit can include multiple light sources and multiple quantum dot material regions. A quantum dot material region can include quantum dot material surrounding a light source. The quantum dot material can produce color light when the quantum dot material is stimulated by the light emitted from the light source. The display device can provide high color gamut light and keep a low power consumption by exciting quantum dots.

Figure 3:
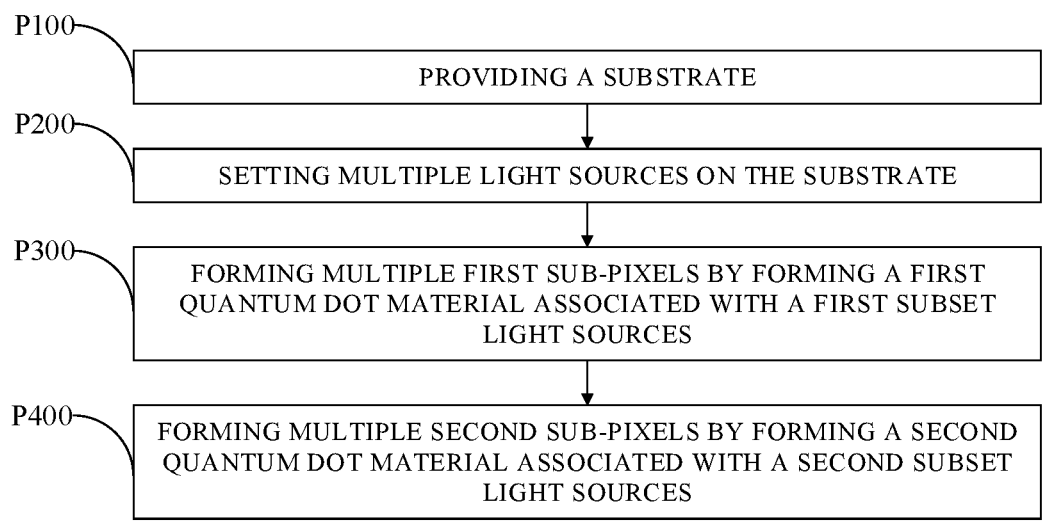
FIG. 3 shows an exemplary method for fabricating a display device in accordance with some embodiments of the disclosed subject matter.

Another aspect of the disclosed subject matter provides a method for fabricating the disclosed display device. As illustrated in FIG. 3, the method can comprise: providing a substrate at P100; setting a plurality of light sources on the substrate at P200; forming a plurality of first color sub-pixels at P300 by forming a first quantum dot material associated with a first subset of the plurality of light sources; and forming a plurality of second color sub-pixels at P400 by forming a second quantum dot material associated with a second subset of the plurality of light sources. Wherein each of the plurality of first color sub-pixels can provide a first color light by stimulating the first quantum dot material with one corresponding light source in the first subset of the plurality of light sources. And each of the plurality of the second color sub-pixels can provide a second color light by stimulating the second quantum dot material with one corresponding light source in the second subset of the plurality of light sources.

Figure 4:
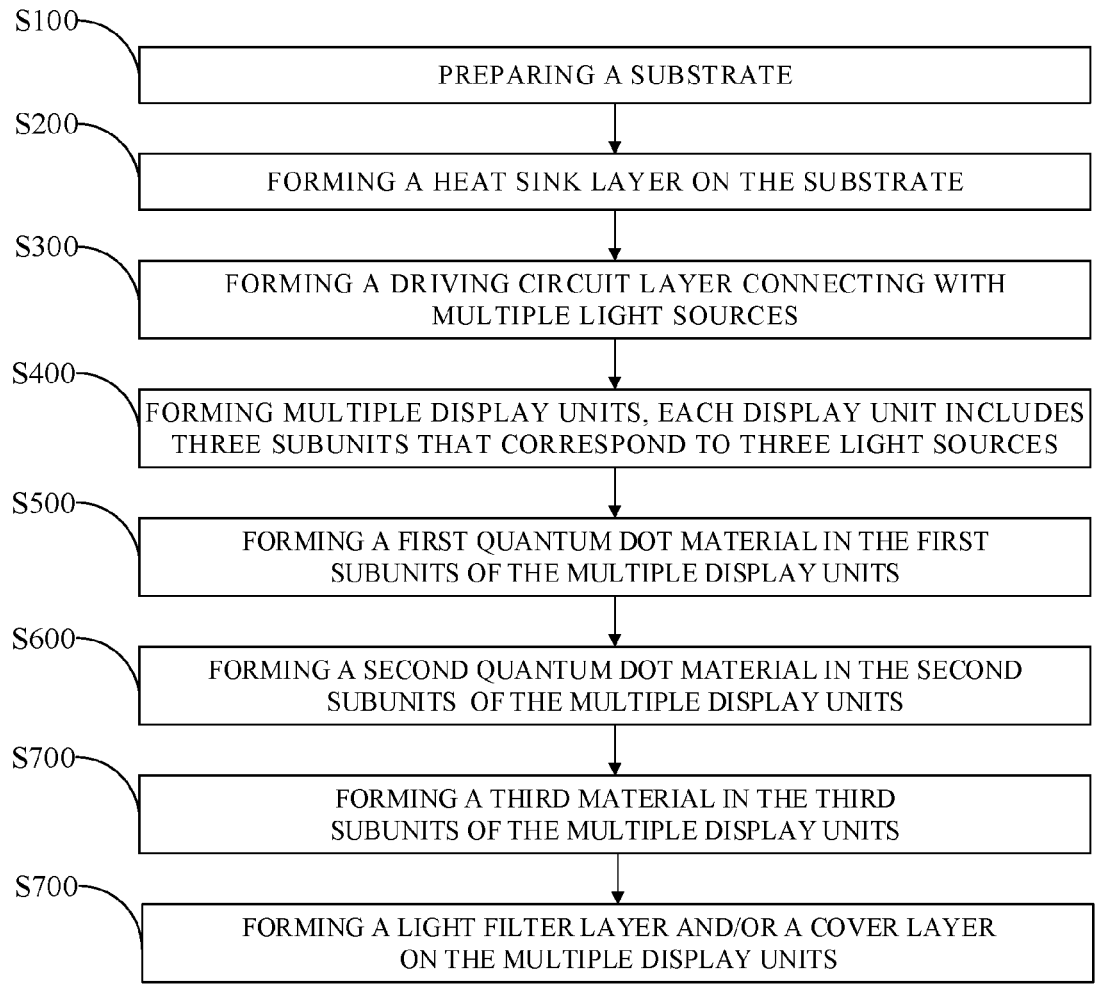
FIG. 4 shows another exemplary method for fabricating a display device in accordance with some embodiments of the disclosed subject matter.

Turning to FIG. 4, another exemplary method for fabricating a display device described above is shown in accordance with some embodiments of the disclosed subject matter.

As illustrated, the method can start at S100 by providing a substrate. In some embodiments, the substrate can be any suitable substrate, such as a glass substrate, a plastic substrate, a metal foil substrate, a flexible substrate, etc.

At S200, a heat sink plate can be formed on the substrate. In some embodiments, the heat sink plate can be any suitable material that has a good thermal conductivity, such as copper, silver, aluminum alloy, or any other suitable composite materials.

At S300, a driving circuit connecting with multiple light sources can be formed on the heat sink plate. In some embodiments, the driving circuit can provide control signals to the multiple light sources. The multiple light sources can be uniformly distributed on the substrate in a two dimensional basis. In some embodiments, the multiple light sources can be any suitable light emitting diodes, such as blue light-emitting-diode (LED) light sources, ultraviolet (UV) LED light sources, etc. In some embodiments, each light source can be a light source for a red-green-blue (RGB) sub-pixel of the display device.

At S400, multiple display units can be formed. The multiple display units can be uniformly distributed on the substrate in a two dimensional basis. Each display unit corresponds to a RGB pixel of the display device. Each display unit includes three subunits that correspond to red sub-pixel, green sub-pixel and blue sub-pixel respectively.

In some embodiments, each subunit include a isolating channel and a corresponding light source in the isolating channel. In some embodiments, an isolating channel can include an isolating layer parallel to the substrate, and one or more isolating walls perpendicular to the substrate. The isolating layer and the one or more isolating walls can include a black resin material. In some embodiments, the isolating channels can be formed by any suitable method, such as photolithography method, bonding method, and/or mold injection method. The isolating channels can optically isolate adjacent subunits.

At 500, a first quantum dot material can be formed in multiple subunits in each of the multiple display units. The first quantum dot material can be formed surrounding the light exiting surface of the light source located in the first isolating channel. The first quantum dot material can provide a first color light when the first quantum dot material is stimulated by the light emitted from the light source located in the first isolating channel.

At 600, a second quantum dot material can be formed in multiple subunits in each of the multiple display units. The second quantum dot material can be formed surrounding the light exiting surface of the light source located in the second isolating channel. The second quantum dot material can provide a second color light when the second quantum dot material is stimulated by the light emitted from the light source located in the second isolating channel.

At S700, a third material can be formed in multiple third subunits in each of the multiple display units. The third material can be formed surrounding the light exiting surface of the light source located in the third isolating channel.

In some embodiments, the third material can be a third quantum dot material. The third quantum dot material can provide a third color light when the third quantum dot material is stimulated by the light emitted from the light source located in the third isolating channel.

In some embodiments, the third material can be a transparent material. The transparent material can be any suitable transparent material, such as a transparent resin material. Transparent material can transmit a third color light emitted from the light source located in the third isolating channel.

In some embodiments, the first color light is a red light, the second color light is a green light, and the third color light is a blue light. The first subunits are red sub-pixels, the second subunits are green sub-pixels, and the third subunits are blue sub-pixels.

In some embodiments, the first quantum dot material, the second quantum dot material, the third quantum dot material, and/or the transparent material can be formed by any suitable process, such as injection process, coating process, or attaching process. For example, the first quantum dot material, the second quantum dot material, the third quantum dot material, and/or the transparent material can be formed by a micro-injection method, such as inkjet method or rotating printing method.

At S800, a light filter layer and/or a cover layer can be formed on the multiple display units. In some embodiments, the color filter layer can be used to adjust the colors of light emitted from the multiple display units. In some embodiments, the cover layer can be used for protecting the display device.

It should be noted that the above steps of the flow diagrams of FIGS. 3 and 4 can be executed or performed in any order or sequence not limited to the order and sequence shown and described in the figures. Also, some of the above steps of the flow diagrams of FIGS. 3 and 4 can be executed or performed substantially simultaneously where appropriate or in parallel to reduce latency and processing times. Furthermore, it should be noted that FIGS. 3 and 4 are provided as examples only. At least some of the steps shown in the figures may be performed in a different order than represented, performed concurrently, or altogether omitted. Some additional steps not shown in the figures may be performed between any of the steps shown in the figure.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, a display device, and a related fabricating method are provided.

Although the disclosed subject matter has been described and illustrated in the foregoing illustrative embodiments, it is understood that the present disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of the present disclosure.

What is claimed is:

1. A display device, comprising: a substrate; and a plurality of display units on the substrate, wherein each of the plurality of display units comprises:
    a first color sub-pixel, comprising a first quantum dot material and a first light source, wherein the first color sub-pixel is configured to provide a first color light by stimulating the first quantum dot material with the first light source, and the first quantum dot material encases the first light source;
    a second color sub-pixel, comprising a second quantum dot material and a second light source, wherein the second color sub-pixel is configured to provide a second color light by stimulating the second quantum dot material with the second light source, and the second quantum dot material encases the second light source; and
    isolating channels for optically isolating the first color sub-pixel and the second color sub-pixel, each of the isolating channels including an isolating layer below a corresponding light source and one or more isolating walls integrated with the isolating layer, and each of the first quantum dot material and the second quantum dot material being located in one of the isolating channels.

2. The display device of claim 1, wherein the first quantum dot material and the second quantum dot material comprise nanoparticles made of Group II-VI or Group III-V elements.

3. The display device of claim 1, wherein the first quantum dot material and the second quantum dot material are same quantum dot material but have different sizes.

4. The display device of claim 1, wherein:
the first color light is red light and the second color light is green light;
the first quantum dot material comprises nanoparticles of CuInSe or InP; and
the second quantum dot material comprises nanoparticles of CuInS.

5. The display device of claim 1, wherein each of the plurality of display units further comprises a light filter layer.

6. The display device of claim 1, further comprising:
a driving circuit connecting with the plurality of light sources; and
a heat sink plate located on the driving circuit.

7. The display device of claim 1, wherein each of the plurality of display units further comprises a third color sub-pixel that comprises a third light source and a transparent material, wherein the transparent material transmits a third color light emitting from the third light source.

8. The display device of claim 7, wherein the first light source, the second light source and the third light source are blue LED light sources.

9. The display device of claim 1, wherein each of the plurality of display units further comprises a third color sub-pixel that comprises a third light source and a third quantum dot material, wherein the third color sub-pixel is configured to provide a third color light by stimulating the third quantum dot material with the third light source.

10. The display device of claim 9, wherein:
the third color light is blue light;
the third light source is a ultraviolet (UV) light source; and
the third quantum dot material comprises nanoparticles of ZnS or CdS.

11. The display device of claim 9, wherein:
each of the isolating channels has a reflecting inner surface for reflecting light.

12. A method for fabricating a display device, the method comprising:
providing a substrate;
forming a plurality of isolating channels, each of the isolating channels including an isolating layer parallel to the substrate and one or more isolating walls integrated with the isolating layer;
setting a plurality of light sources on the substrate, each of the light sources being in one of the isolating channels;
forming a plurality of first color sub-pixels by forming a first quantum dot material associated with a first subset of the plurality of light sources and in a first subset of the isolating channels; and
forming a plurality of second color sub-pixels by forming a second quantum dot material associated with a second subset of the plurality of light sources and in a second subset of the isolating channels;
wherein each of the plurality of first color sub-pixels is configured to provide a first color light by stimulating the first quantum dot material with one corresponding light source in the first subset of the plurality of light sources, and the first quantum dot material encases the corresponding light sources;
wherein each of the plurality of second color sub-pixels is configured to provide a second color light by stimulating the second quantum dot material with one corresponding light source in the second subset of the plurality of light sources, and the second quantum dot material encases the corresponding light sources; and
wherein the isolating channels optically isolate the first color sub-pixels and the second color sub-pixels.

13. The method of claim 12, wherein:
the first quantum dot material comprises nanoparticles of a material in a first size range; and
the second quantum dot material comprises nanoparticles of the material in a second size range.

14. The method of claim 12, further comprising:
forming a plurality of third color sub-pixels by forming a third quantum dot material associated with a third subset of the plurality of light sources;
wherein each of the plurality of third color sub-pixels is configured to provide a third color light by stimulating the third quantum dot material with one corresponding light source in the third subset of the plurality of light sources.

15. The method of claim 12, further comprising:
forming a plurality of third color sub-pixels by forming a transparent material associated with a third subset of the plurality of light sources;
wherein each of the plurality of third color sub-pixels can provide a third color light by transmits a third color light emitting from one corresponding light source in the third subset of the plurality of light sources through the transparent material.

16. The method of claim 12, further comprising setting a driving circuit connecting with the plurality of light sources.

17. The method of claim 16, further comprising setting a heat sink plate located on the driving circuit.

18. The method of claim 12, further comprising:
forming reflecting inner surfaces for each isolating channel.

19. The method of claim 18, further comprising forming a light filter layer on the plurality of isolating channels.

20. The method of claim 18, further comprising forming a cover layer on the plurality of isolating channels.

* * * * *